United States Patent
Fouti-Makaya

(10) Patent No.: US 7,439,629 B2
(45) Date of Patent: Oct. 21, 2008

(54) ASYNCHRONOUS GENERATOR WITH GALVANO-MAGNETIC-THERMAL EFFECT

(75) Inventor: Zacharie Fouti-Makaya, Fraisse Gabardes (FR)

(73) Assignee: Fouti-Makaya Innovations, Colomiers (FR)

( * ) Notice: Subject to any disclaimer, the term of this patent is extended or adjusted under 35 U.S.C. 154(b) by 394 days.

(21) Appl. No.: 11/166,352

(22) Filed: Jun. 27, 2005

(65) Prior Publication Data

US 2006/0181270 A1 Aug. 17, 2006

Related U.S. Application Data

(63) Continuation of application No. PCT/FR03/03894, filed on Dec. 24, 2003.

(30) Foreign Application Priority Data

Dec. 27, 2002 (FR) .................................. 02 16754

(51) Int. Cl.
*H02P 9/04* (2006.01)
(52) U.S. Cl. ..................................... 290/1 R
(58) Field of Classification Search ................. 290/1 R; 310/306; 136/203, 205; 62/3.3, 3.1, 3.2
See application file for complete search history.

(56) References Cited

U.S. PATENT DOCUMENTS

| | | | |
|---|---|---|---|
| 3,004,393 A * | 10/1961 | Alsing | 62/3.3 |
| 3,084,267 A | 4/1963 | Newell | |
| 3,386,255 A * | 6/1968 | Venema | 62/3.2 |
| 3,664,881 A * | 5/1972 | Love | 136/205 |
| 4,467,611 A * | 8/1984 | Nelson et al. | 62/3.3 |
| 5,024,059 A * | 6/1991 | Noble | 62/3.1 |
| 5,563,368 A * | 10/1996 | Yamaguchi | 136/205 |
| 5,593,509 A * | 1/1997 | Zuppero et al. | 136/253 |
| 5,942,834 A * | 8/1999 | Davis | 310/306 |
| 2004/0168716 A1* | 9/2004 | Gritskevich et al. | 136/205 |
| 2005/0022855 A1* | 2/2005 | Raver | 136/205 |
| 2005/0139248 A1* | 6/2005 | Strnad | 136/205 |
| 2005/0172992 A1* | 8/2005 | Shimoji et al. | 136/208 |

FOREIGN PATENT DOCUMENTS

| | | |
|---|---|---|
| DE | 24 04 786 | 8/1975 |
| EP | 0 644 599 | 3/1995 |
| FR | 1 208 159 | 2/1960 |

* cited by examiner

*Primary Examiner*—Julio Gonzalez
(74) *Attorney, Agent, or Firm*—Young & Thompson

(57) ABSTRACT

The generator includes:
  elements (4, 10) for generating a magnetic field in a first direction,
  a hot source (6) and a cold source (8) creating a temperature gradient ($\nabla T$) in a second direction substantially perpendicular to the first direction, and
  at least one element (2; 14) having thermoelectric conversion properties, disposed in a plane substantially perpendicular to the direction of the temperature gradient ($\nabla T$). The magnetic field generated is a field of traveling waves moving in the second direction. Each element having thermoelectric conversion properties has a continuous form in the plane perpendicular to the second direction.

18 Claims, 2 Drawing Sheets

ASYNCHRONOUS GENERATOR WITH GALVANO-MAGNETIC-THERMAL EFFECT

BACKGROUND OF THE INVENTION

1 Field of the Invention

Figure 1:
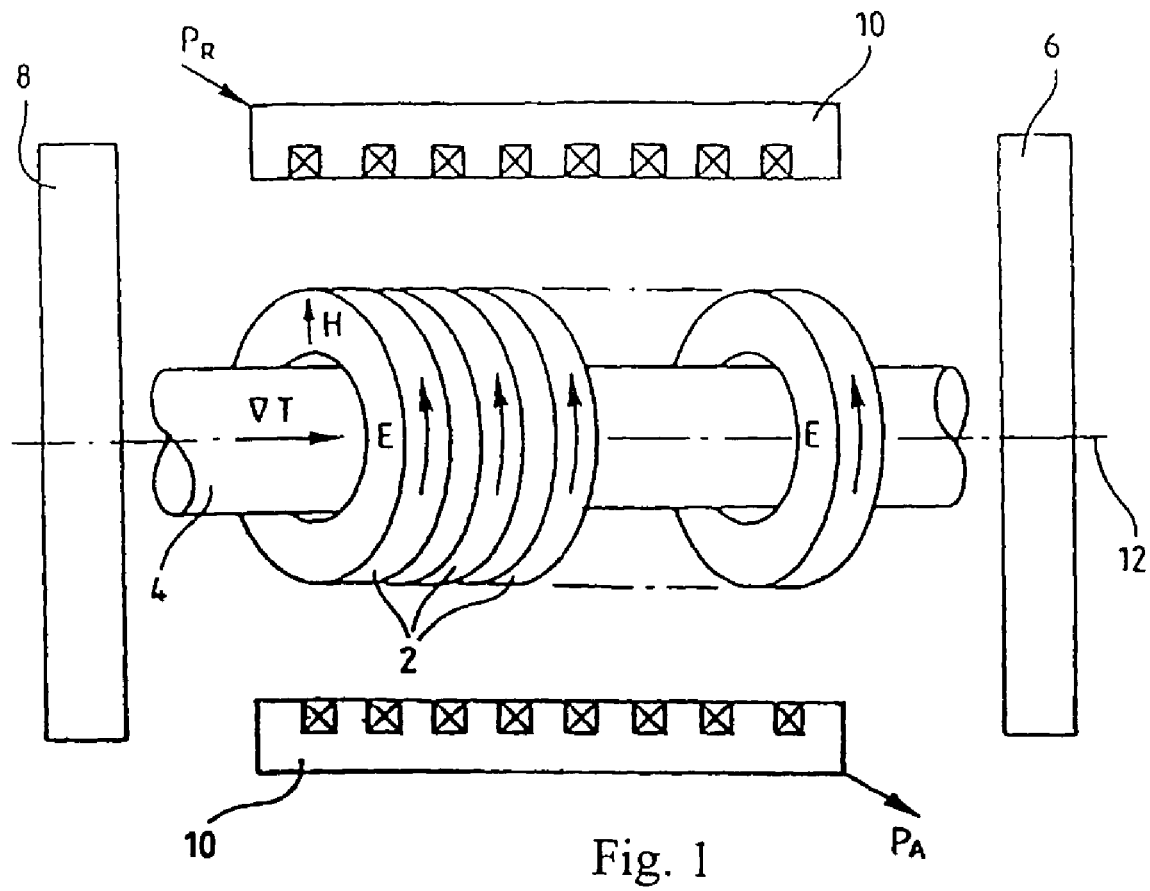

The present invention concerns a galvano-magneto-thermal effect asynchronous generator.

2 Descripton of the Related Art

Here this involves producing a generator using the thermoelectric properties of certain materials. Such a generator is connected both to a hot source and to a cold source. It may then operate either as a heat pump, or as an electric generator. In the first case, the generator takes energy from the cold source to deliver it to the hot source. In the second case, an energy transfer is made from the hot source to the cold source with production of electrical energy.

Document EP-0 644 599 describes a thermoelectric generator device producing electrical energy from thermal energy using the Nernst effect. The described device comprises a conversion element made from a material having thermoelectric properties, magnetic field generating means, and means for heating and cooling so as to create a temperature gradient perpendicular to the magnetic field. The element having thermoelectric properties is split and each edge of the split comprises an electrode. A difference in potential appears between these two electrodes in the presence of the magnetic field and the temperature gradient. The drawback of such a device is that the difference in potential between two electrodes is at best of the order of one Volt. Several elements must therefore be coupled together to obtain higher voltages. The power provided by such a device is furthermore relatively low. Due to this the energy yield is also very low.

BRIEF SUMMARY OF THE INVENTION.

The object of the present invention is thus to provide an electric generator using the Nernst effect to obtain a worthwhile yield permitting economically worthwhile exploitation.

To that end, it provides a galvano-magneto-thermal effect asynchronous generator comprising:
  means for generating a magnetic field in a first direction,
  a hot source and a cold source creating a temperature gradient in a second direction substantially perpendicular to the first direction, and
  at least one element having thermoelectric conversion properties, disposed in a plane substantially perpendicular to the direction of the temperature gradient.

According to the invention, the magnetic field generated is a field of traveling waves moving in the second direction, and each element having thermoelectric conversion properties has a continuous form in the plane perpendicular to the second direction.

In this way, a short-circuited electric field is generated at the elements having thermoelectric conversion properties. It then becomes possible to recover an electric current at the magnetic field generating means. The result of this generator device is that a signal consuming essentially reactive power is sent to create a magnetic field and by virtue of the thermoelectric conversion, it is possible to recover an electric current and active power.

A first embodiment provides that generator according to the invention comprises several elements having thermoelectric conversion properties, each of those elements having an annular form and being disposed in a plane perpendicular to the second direction. In another embodiment, the element having thermoelectric conversion properties is for example of tubular cylindrical form and extends in the second direction.

For a better yield of the device, a material is chosen for each element having thermoelectric conversion properties which has a worthwhile Nernst coefficient. Provision is thus made for producing those elements using indium antimonide (InSb).

The magnetic field generating means comprise for example both a ferromagnetic core as well as inductors in the form of electrically powered coils.

In another variant embodiment, the magnetic field generating means comprise inductors in the form of electrically powered coils, those inductors being arranged two by two with one facing the other such that in the gap between two corresponding inductors there is at least one element having thermoelectric conversion properties.

Self-excitation of the generator device may be envisaged. In this case, a part of the current generated is used to power the inductors.

To increase the yield of a generator according to the invention, the inductors are advantageously formed by superconducting windings.

BRIEF DESCRIPTION OF THE DRAWING FIGS.

Figure 2:
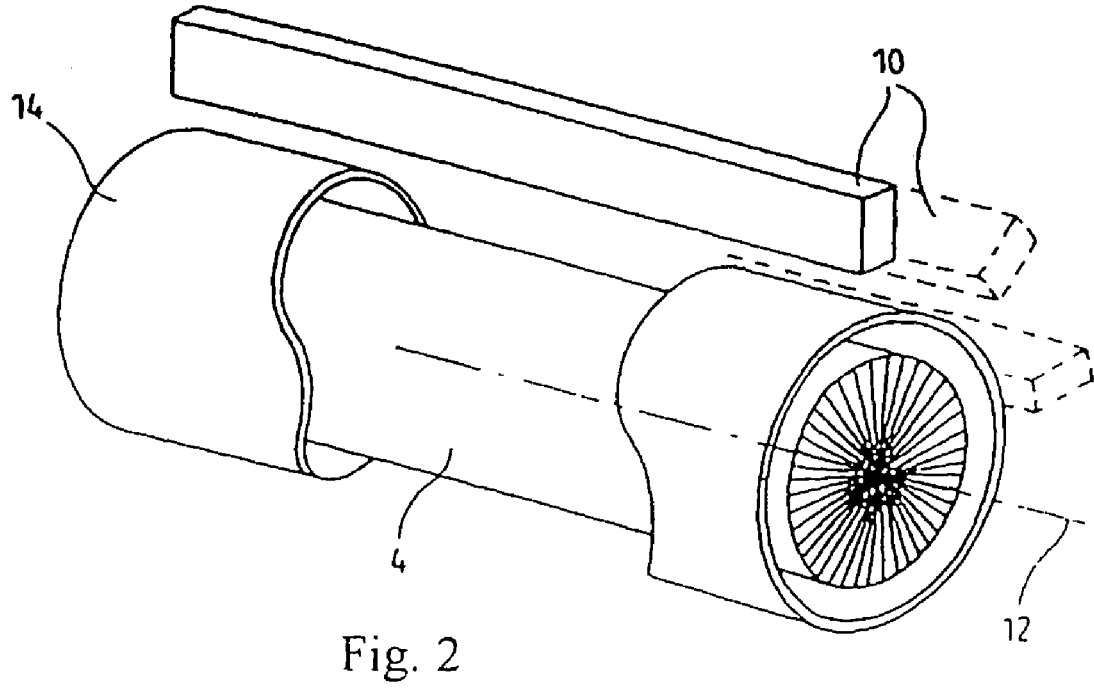
Figure 3:
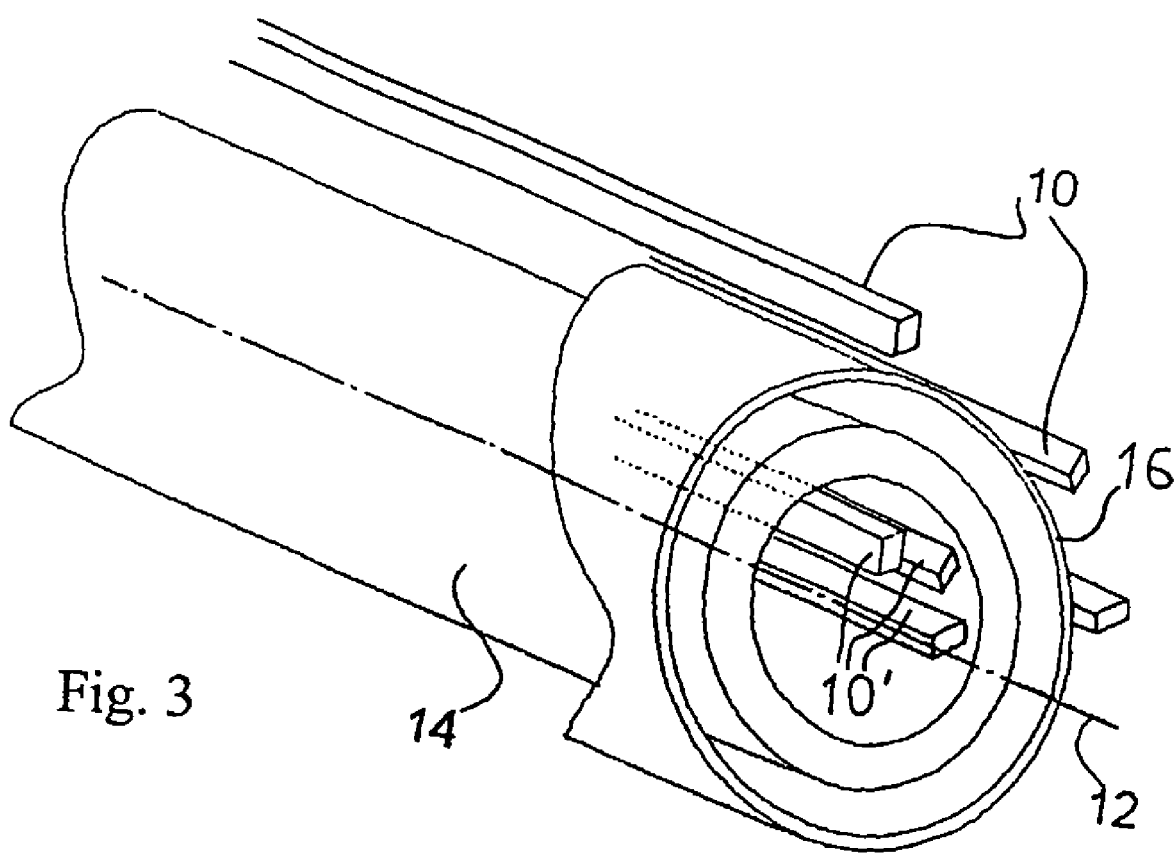
Figure 4:
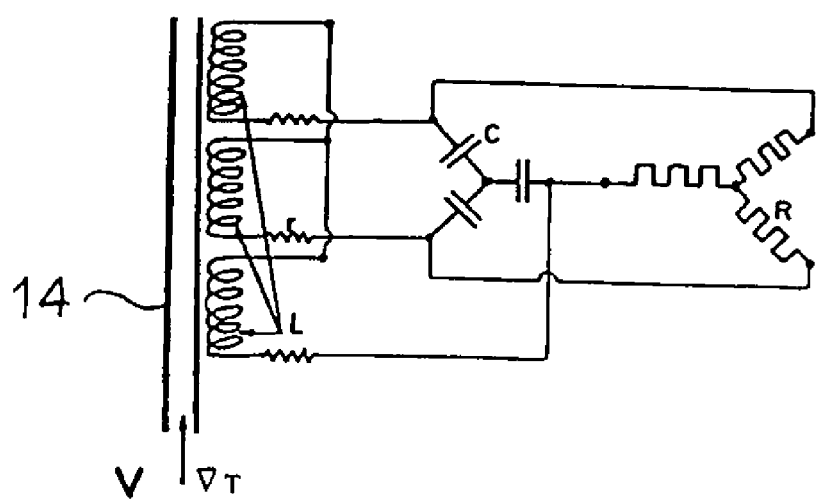

Details and advantages of the invention will appear more clearly from the following description, made with reference to the accompanying drawings in which:

FIG. 1 is a synoptic diagram of a first embodiment of a generator according to the invention, FIG. 2 is a diagram of a variant embodiment of the generator of FIG. 1, FIG. 3 shows a variant embodiment of the generator of FIG. 2, and FIG. 4 shows a wiring diagram of the principle of a circuit enabling the self-excitation to be achieved for a generator of FIGS. 1 to 3.

DETAILED DESCRIPTION OF THE PREFERRED EMBODIMENTS

FIG. 1 shows in diagram form the annular elements 2 having thermoelectric conversion properties, a magnetic core 4, a hot source 6, a cold source 8 and inductors 10.

The annular elements 2 are thus subjected both to a temperature gradient $\nabla T$ and to a magnetic field H. Given the thermoelectric properties of the annular elements 2, an electric field E is created in each of those rings. The creation of that electric field is also known as the Nernst effect.

In the embodiment shown in FIG. 1, it can be seen that the device has rotational symmetry about a longitudinal axis 12. The temperature gradient $\nabla T$ is parallel to that rotational axis whereas the magnetic field H is radial with respect to that axis. The electric field is given by the following equation:

$$\vec{E} = N \vec{H} \wedge \vec{\nabla} T$$

Where N is the Nernst coefficient and where the operator ^ represents a vector product. Under these conditions, the electric field E is at every point perpendicular both to the magnetic field H and to the temperature gradient. The circulation of the electric field E is thus tangential.

The hot source 6 may be for example a hot source produced by a thermal power plant or equivalent. The cold source 8 is obtained by a cooling system. Thermal insulation, not shown in the drawing, makes it possible to insulate the hot source 6 from the cold source 8.

The inductors 10 are powered with alternating current so as to create, with the aid of the core 4, a magnetic field H at the annular elements 2. Power is supplied such that a traveling magnetic wave moves longitudinally with respect to the axis 12. A sliding magnetic field is thus created moving in the direction of that axis 12. The structure here is close to that of an annular electromagnetic pump using sodium. Here, the stream of liquid sodium is replaced by the succession of annular elements 2. A material is chosen here to form those rings that has a high Nernst coefficient. Indium antimonide (InSb) is suitable for such an application.

The inductors 10 may be single-phase or polyphase, preferably three-phase. As stated above, they generate a sinusoidal traveling induction wave at the annular elements 2. This induction wave is termed induction or primary wave. This wave moving relative to the thermoelectric material induces in each annular element 2 a system of polyphase currents that are closed on themselves These currents in turn create a traveling sinusoidal induction distribution termed secondary or induction reaction wave. This second wave is stationary with respect to the first. Everything occurs here like in an electro-mechanical converter implementing two traveling or turning fields of the same speed.

The system described may operate as a generator or receiver. When the transport parameter of the material constituting the annular elements 2 is greater than the speed of the primary field, the system operates as a generator. It operates as a receiver in the opposite case. The electrical energy exchanged between the network and the device represented in the drawing appears in the inductors 10, such that there is no electrical contact between the armature and any other part of the device.

The transport parameter concerned here has the dimensions of a speed. It corresponds to N.∇T where N is the Nernst coefficient and where ∇T is the temperature gradient. For indium antimonide, a temperature in the neighborhood of 300 K gives $N=(-5.7\,e^{(T-273)/65}-3.2)*10^{-5}\,m^2\,K^{-1}\,s^{-1}$ (according to the article by H. Nakamura, K. Ikeda, S. Yamaguchi, and K. Kuroda, *Transport coefficients of thermoelectric semiconductor InSb in the magnetic field*, J. Adv. Sci., 8 (1996), 153 (in Japanese)).

There is also an analogy here with annular electromagnetic pumps using sodium. This is because, when such a pump operates as a pump, a current is sent to its windings creating a traveling magnetic field and the sodium moves at a speed less than the traveling speed of the magnetic wave. If on the other hand the fluid circulates faster than the primary magnetic wave, the pump operates as a generator (cf article by F. JOUSSELLIN et al. *M.H.D. induction generator at weak magnetic Reynolds number*. EUROPEAN JOURNAL OF MECHANICS, B/FLUIDS, VOL. 8, N° 4, 1989© Gauthier-Villars).

The generator, which may also operate as an asynchronous galvano-thermo -magnetic receiver according to the invention operates according to the same principle as a linear transformer of which the secondary winding is a short-circuit. In the embodiments represented, the structure of this generator is linear since the inductors produce a sliding induction. As regards the armature, this is fixed.

Also by analogy with existing electrical machines, whereas the rotor of an asynchronous motor is constituted by conductors (wound rotor or rotor with cage), the linear armature of the present device is constituted by annular elements (FIG. 1) or by a tube (FIG. 2), the induced currents circulating in the actual mass of those elements or that tube. Furthermore, whereas a rotary motor has only one induction stator, the generator according to the invention preferably uses two inductors facing each other. As in FIGS. 1 and 2, it is also possible to have an inductor facing a magnetic core 4. Such an arrangement has the advantage both of facilitating the flux in the magnetic circuit as well as increasing the induction in the gap. A greater width of gap is thus produced. Finally, whereas a rotary motor has a fixed inductor and a moving armature, the linear generator according to the invention may have either of the two following static arrangements:

the armature is shorter than the inductor which is then assumed to be infinitely long: the generator is then said to be a "long inductor" generator, the inductor is shorter than the armature which is then assumed to be infinitely long: the generator is then said to be a "short inductor" generator.

In the embodiment of FIG. 2, the annular elements 2 are replaced by a tube 14. In that Figure, a magnetic core 4 is also found placed at the center of the tube 14, the assembly formed by the core and the tube being surrounded by inductors 10 evenly spaced around the periphery of the tube. This is also a device with a axis of revolution 12.

The tube is preferably also produced here from indium antimonide. Other materials may be used such as lead, bismuth and antimony tellurides and selenides, or certain alloys of silicon and germanium. Of course, this list is not exhaustive.

As with the device of FIG. 1, the inductors are powered here, preferably by three-phase, so as to create a traveling magnetic wave in the tube 14. The electric field then created in the tube 14, when the device is operating as a generator, in its turn induces a current in the inductors 10. These latter thus both absorb a part of the reactive power $P_R$ as well as supplying part of the active power $P_A$ supplied by virtue of the electric field created in the thermoelectric material.

FIG. 3 shows a variant embodiment comparable to the embodiment represented in FIG. 2. Here, the magnetic core is replaced by the inductors 10'. The operation of this device is thus similar to that described earlier with reference to FIG. 2. In that Figure, an insulating jacket 16 has also been represented. The purpose of the latter is to thermally insulate the thermoelectric tube 14 in order not to degrade the temperature gradient. Of course, the material chosen for producing the insulating jacket 16 is a magnetically permeable material.

It may also be envisaged to self-excite the generator. Such self-excitation may be implemented as described in the article by F. JOUSSELLIN et al. cited earlier. Capacitors are then used for powering the inductors. These capacitors are preferably powered by part of the current generated. FIG. 4 shows a wiring diagram (taken from the aforementioned article) of a device enabling such self-excitation to be implemented. It is considered here that the generator is operating in three-phase mode. Three inductance coils L have therefore been represented, one phase of the three-phase current corresponding to each of the coils. The coils represented here are coils of an inductor 10 (or 10') of FIGS. 1 to 3. As each coil is not pure inductance, a resistance r has also been represented corresponding to each coil. The tube 14 of FIGS. 2 and 3 has also been represented in FIG. 4. V is the speed of the traveling wave generated by the coils in the thermoelectric material constituting the tube 14. It is substantially parallel to the temperature gradient ∇T. The values C and R correspond to capacitances and resistances. They define, with the value L of the inductance of the coils, the pulsation of the oscillations creating a magnetic field in the tube 14.

To increase the yield of the device, it may be envisaged to use superconducting windings to form the inductors 10.

As mentioned above, it is possible to replace the magnetic core with a set of inductors (FIG. 3). Inductors then face each other. To have greater space for the inductors located within the device, it may also be envisaged to have a planar structure. In this case, a plate of thermoelectric material may for example be provided, which is preferably circular and planar. Inductors then extend radially on both faces thereof. There is thus a thermoelectric disc sandwiched between two networks of inductors in a star arrangement. The temperature gradient is then also radial. It may for example be assumed that the center of the thermoelectric disc will be heated and its periphery cooled. Of course, the disc of thermoelectric material may hollowed out at its center.

The present invention is not limited to the embodiments and the variants thereof described above by way of non-limiting examples. It also concerns all variant embodiments within the capability of the person skilled in the art in the context of the claims given below.

The invention claimed is:

1. A galvano-magneto-thermal effect asynchronous generator, comprising:
    means (4, 10) for generating a magnetic field in a first direction;
    a hot source (6) and a cold source (8) creating temperature gradient ($\nabla T$) in a second direction substantially perpendicular to the first direction; and
    at least one element (2; 14) having thermoelectric conversion properties, disposed in a plane substantially perpendicular to the direction of the temperature gradient ($\nabla T$),
    wherein the magnetic field generated is a field of traveling waves moving in the second direction, and in that each element having thermoelectric conversion properties has a continuous form in the plane perpendicular to the second direction.

2. An asynchronous generator according to claim 1, wherein the generator comprises several elements (2) having thermoelectric conversion properties, each of those elements having an annular form and being disposed in a plane perpendicular to the second direction.

3. An asynchronous generator according to claim 1, wherein the generator comprises an element (14) having thermoelectric conversion properties of tubular cylindrical form extending in the second direction.

4. An asynchronous generator according to claim 1, wherein each element (2, 14) having thermoelectric conversion properties is produced using indium antimonide (InSb).

5. An asynchronous generator according to claim 1, wherein the magnetic field generating means comprise both a ferromagnetic core (4) as well as inductors (10) in the form of electrically powered coils.

6. An asynchronous generator according to claim 1, wherein the magnetic field generating means comprise inductors in the form of electrically powered coils, those inductors being arranged two by two with one facing the other such that in the gap between two corresponding inductors there is at least one element having thermoelectric conversion properties.

7. An asynchronous generator according to claim 5, wherein a part of the current generated is used to power the inductors.

8. An asynchronous generator according to claim 5, wherein the inductors are formed by superconducting windings.

9. An asynchronous generator according to claim 2, wherein the magnetic field generating means comprise both a ferromagnetic core (4) as well as inductors (10) in the form of electrically powered coils.

10. An asynchronous generator according to claim 3, wherein the magnetic field generating means comprise both a ferromagnetic core (4) as well as inductors (10) in the form of electrically powered coils.

11. An asynchronous generator according to claim 4, wherein the magnetic field generating means comprise both a ferromagnetic core (4) as well as inductors (10) in the form of electrically powered coils.

12. An asynchronous generator according to claim 2, wherein the magnetic field generating means comprise inductors in the form of electrically powered coils, those inductors being arranged two by two with one facing the other such that in the gap between two corresponding inductors there is at least one element having thermoelectric conversion properties.

13. An asynchronous generator according to claim 3, wherein the magnetic field generating means comprise inductors in the form of electrically powered coils, those inductors being arranged two by two with one facing the other such that in the gap between two corresponding inductors there is at least one element having thermoelectric conversion properties.

14. An asynchronous generator according to claim 4, wherein the magnetic field generating means comprise inductors in the form of electrically powered coils, those inductors being arranged two by two with one facing the other such that in the gap between two corresponding inductors there is at least one element having thermoelectric conversion properties.

15. An asynchronous generator according to claim 6, wherein a part of the current generated is used to power the inductors.

16. An asynchronous generator according to claim 6, wherein the inductors are formed by superconducting windings.

17. An asynchronous generator according to claim 7, wherein the inductors are formed by superconducting windings.

18. A galvano-magneto-thermal effect asynchronous generator, comprising:
    means (4, 10) for generating a magnetic field in a first direction, said means for generating a magnetic field being configured to be powered by alternating current;
    a hot source (6) and a cold source (8) creating a temperature gradient ($\nabla T$) in a second direction substantially perpendicular to the first direction; and
    at least one element (2; 14) having thermoelectric conversion properties, disposed in a plane substantially perpendicular to the direction of the temperature gradient ($\nabla T$),
    wherein the magnetic field generated is a field of traveling waves moving in the second direction, and in that each element having thermoelectric conversion properties has a continuous form in the plane perpendicular to the second direction.

* * * * *